United States Patent
Kim et al.

(10) Patent No.: US 10,368,417 B2
(45) Date of Patent: Jul. 30, 2019

(54) DISPLAY DEVICE HAVING SEMICONDUCTOR LIGHT-EMITTING DEVICE WITH INCLINED PORTION

(71) Applicant: LG ELECTRONICS INC., Seoul (KR)

(72) Inventors: Seonock Kim, Seoul (KR); Hwankuk Yuh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/740,179

(22) PCT Filed: Jul. 5, 2016

(86) PCT No.: PCT/KR2016/007251
§ 371 (c)(1),
(2) Date: Dec. 27, 2017

(87) PCT Pub. No.: WO2017/007215
PCT Pub. Date: Jan. 12, 2017

(65) Prior Publication Data
US 2018/0192495 A1    Jul. 5, 2018

(30) Foreign Application Priority Data
Jul. 6, 2015  (KR) .......................... 10-2015-0095989

(51) Int. Cl.
*H01L 33/10* (2010.01)
*H05B 33/10* (2006.01)
(Continued)

(52) U.S. Cl.
CPC .............. *H05B 33/10* (2013.01); *F21K 9/90* (2013.01); *F21K 99/00* (2013.01); *H01L 33/24* (2013.01);
(Continued)

(58) Field of Classification Search
None
See application file for complete search history.

(56) References Cited

U.S. PATENT DOCUMENTS 6,472,718 B2 * 10/2002 Lell ..................... H01L 21/7605
257/443
7,015,512 B2   3/2006 Park et al.
(Continued)

FOREIGN PATENT DOCUMENTS

KR  10-2009-0053435 A   5/2009
KR  10-2014-0063560 A   5/2014
(Continued)

*Primary Examiner* — Bilkis Jahan
(74) *Attorney, Agent, or Firm* — Birch, Stewart, Kolasch & Birch, LLP

(57) ABSTRACT

The present invention relates to a display device and, particularly, to a display device using a semiconductor light-emitting device. The display device according to the present invention comprises a semiconductor light-emitting device, and the semiconductor light-emitting device comprises: a first conductive semiconductor layer; a second conductive semiconductor layer having a lateral surface, and overlapped with the first conductive semiconductor layer; a first conductive electrode electrically connected to the first conductive semiconductor layer; and a second conductive electrode electrically connected to the second conductive semiconductor layer, wherein the second conductive semiconductor layer has an inclined part inclined with respect to the lateral surface, and the second conductive electrode is formed so as to cover the inclined part.

13 Claims, 20 Drawing Sheets

(51) Int. Cl.
*F21K 99/00* (2016.01)
*H05B 33/14* (2006.01)
*H05B 37/02* (2006.01)
*F21K 9/90* (2016.01)
*H01L 33/24* (2010.01)
*H01L 33/38* (2010.01)
*H05B 33/26* (2006.01)
*H01L 25/075* (2006.01)

(52) U.S. Cl.
CPC .............. *H01L 33/38* (2013.01); *H05B 33/14* (2013.01); *H05B 33/26* (2013.01); *H05B 37/02* (2013.01); *H01L 25/0753* (2013.01)

(56) References Cited

U.S. PATENT DOCUMENTS

| | | | |
|---|---|---|---|
| 7,649,210 B2* | 1/2010 | Yoo | H01L 33/44 257/98 |
| 7,842,958 B1* | 11/2010 | Sekine | H01L 33/382 257/88 |
| 9,006,775 B1* | 4/2015 | Kuo | H01L 33/382 257/100 |
| 2006/0097629 A1* | 5/2006 | Son | H01L 51/5281 313/504 |
| 2010/0047943 A1* | 2/2010 | Lee | H01L 27/153 438/28 |
| 2011/0278600 A1* | 11/2011 | Lin | H01L 27/153 257/88 |
| 2013/0256712 A1* | 10/2013 | Hwang | H01L 27/156 257/88 |
| 2016/0064611 A1* | 3/2016 | Choi | H01L 33/382 257/98 |

FOREIGN PATENT DOCUMENTS

| KR | 10-2014-0127694 A | 11/2014 |
|---|---|---|
| KR | 10-2015-0047365 A | 5/2015 |

\* cited by examiner

DISPLAY DEVICE HAVING SEMICONDUCTOR LIGHT-EMITTING DEVICE WITH INCLINED PORTION

CROSS REFERENCE TO RELATED APPLICATIONS

This application is the National Phase of PCT International Application No. PCT/KR2016/007251, filed on Jul. 5, 2016, which claims priority under 35 U.S.C. 119(a) to Patent Application No. 10-2015-0095989, filed in Republic of Korea on Jul. 6, 2015, all of which are hereby expressly incorporated by reference into the present application.

BACKGROUND OF THE INVENTION

1. Field of the Invention

The present disclosure relates to a display device and a manufacturing method therefor, and more particularly, to a flexible display device using a semiconductor light-emitting device.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs).

However, there exist problems such as not-so-fast response time, difficult implementation of flexibility in case of LCDs, and there exist drawbacks such as short life span, not-so-good yield as well as low flexibility in case of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light-emitting devices may be used to implement a flexible display, thereby presenting a scheme for solving the problems.

However, if an n-contact and a p-contact process are located on the top and bottom in the manufacturing process, an additional process or an additional transfer process may be required subsequent to transferring the semiconductor light-emitting device to a substrate. Furthermore, in the case of one-directional electrode wiring, only mesa and isolation processes are required to make n-contact and p-contact. Accordingly, the present disclosure proposes a mechanism capable of further simplifying the process and implementing electrode wiring.

SUMMARY OF THE INVENTION

An object of the present disclosure is to provide a semiconductor light-emitting device capable of further simplifying the process and implementing n-contact and p-contact, a display device having the same, and a manufacturing method thereof.

Another object of the present disclosure is to implement a display device capable of arranging semiconductor light-emitting devices in a fine pitch and a manufacturing method thereof.

A display device according to the present disclosure may a semiconductor light-emitting device, and the semiconductor light-emitting device may include a first conductive semiconductor layer, a second conductive semiconductor layer provided with a lateral surface to overlap with the first conductive semiconductor layer, a first conductive electrode electrically connected to the first conductive semiconductor layer, and a second conductive electrode electrically connected to the second conductive semiconductor layer, wherein the second conductive semiconductor layer is provided with an inclined portion inclined with respect to the lateral surface, and the second conductive electrode is configured to cover the inclined portion.

According to an embodiment, the inclined portion may extend to the first conductive semiconductor layer. The second conductive electrode may extend from the inclined portion to the lateral surface, and protrude from the lateral surface in a direction away from the second conductive semiconductor layer.

Furthermore, the present disclosure may include sequentially growing a second conductive semiconductor layer and a first conductive semiconductor layer on a substrate to dispose the second conductive semiconductor layer below the first conductive semiconductor layer, depositing a mask on the first conductive semiconductor layer, etching the first conductive semiconductor layer and the second conductive semiconductor layer to form a plurality of semiconductor light-emitting devices, and remove the mask, and depositing a first conductive electrode and a second conductive electrode on the first conductive semiconductor layer and the second conductive semiconductor layer, respectively. The second conductive semiconductor layer may be provided with an inclined portion inclined with respect to a lateral surface of the semiconductor light-emitting devices, and the second conductive electrode may be configured to cover the inclined portion.

According to an embodiment, the display device may include a phosphor layer disposed to cover the plurality of semiconductor light-emitting devices, and the second wiring line may surround an exit surface of the semiconductor light-emitting device to reflect light reflected from the phosphor layer toward the front surface of the semiconductor light-emitting device. An anti-reflection layer may be formed below the phosphor layer.

In a display device according to the present disclosure, a post for n-contact may be formed on a semiconductor light-emitting device, thereby implementing the semiconductor light-emitting device capable of allowing electrode wiring to be vertically arranged without increasing the process. Furthermore, through this, though using a simpler process, it may be possible to have a fine pitch arrangement for semiconductor light-emitting devices in a display device.

In addition, as an inclined portion is formed using a shape of a mask, a mesa process for a light emitting region and a p-contact region and an isolation process for an n-contact region may be replaced by a single etching process.

Moreover, n-contact and p-contact have already been made, and thus an additional process subsequent to transferring semiconductor light-emitting devices to a flexible substrate may be excluded.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
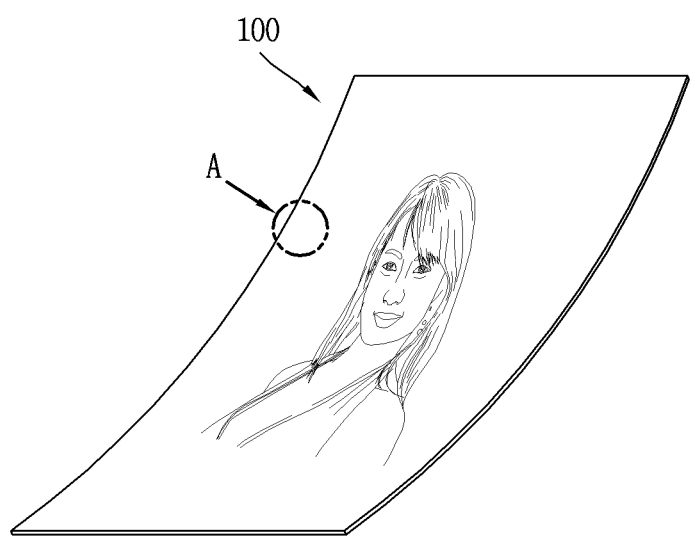
FIG. 1 is a conceptual view illustrating a display device using a semiconductor light-emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the present disclosure, if a detailed explanation for a related known function or construction is considered to unnecessarily divert the gist of the present disclosure, such explanation has been omitted but would be understood by those skilled in the art. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light-emitting device according to an embodiment of the present disclosure.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be realized in such a manner that a light emission of each unit pixel (sub-pixel) arranged in a matrix configuration is controlled independently. The unit pixel denotes an elementary unit for representing one color.

The sub-pixel of the flexible display may be implemented by a semiconductor light-emitting device. According to the present disclosure, a light emitting diode (LED) is illustrated as a type of semiconductor light-emitting device. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
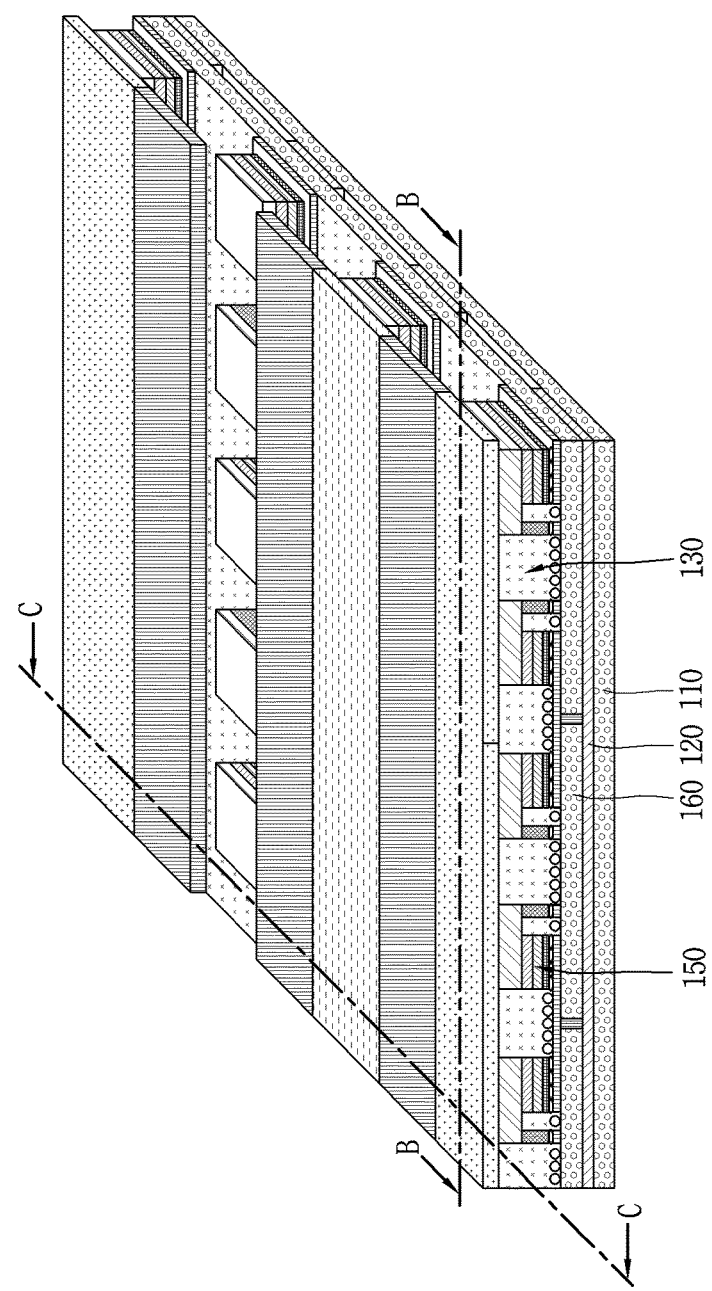
FIG. 2 is a partial enlarged view of portion "A" in FIG. 1.
Figure 3A:
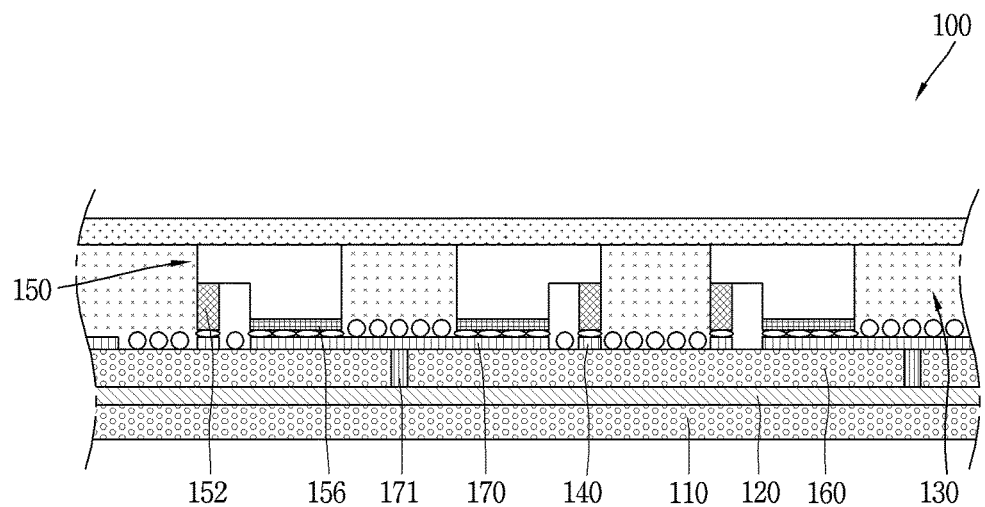
FIGS. 3A and 3B are cross-sectional views taken along lines B-B and C-C in FIG. 2.
Figure 3B:
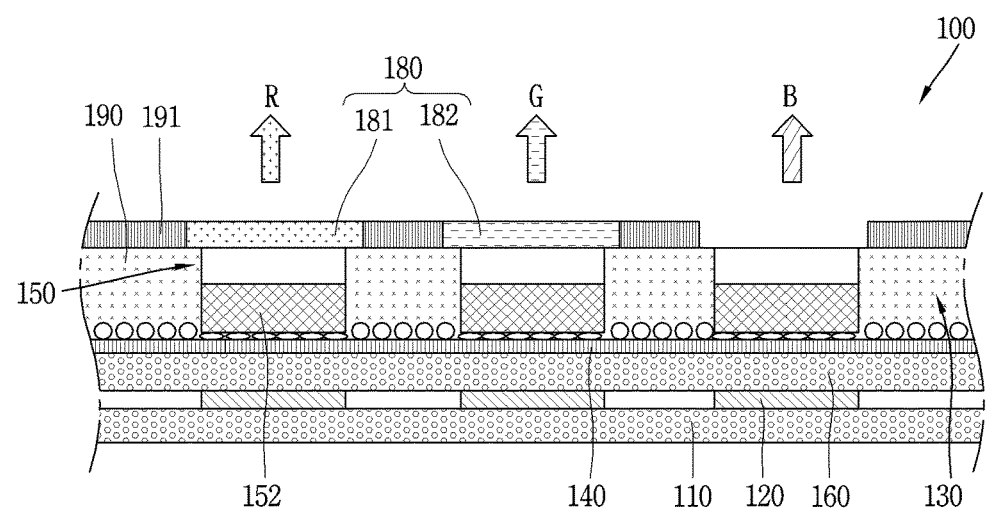
Figure 4:
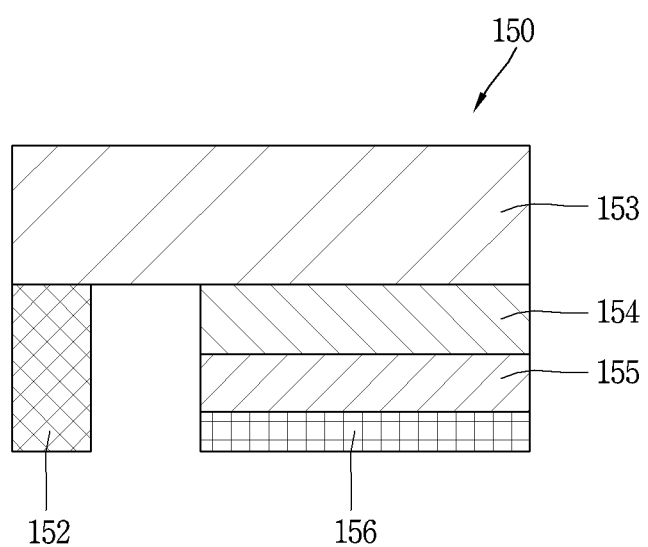
FIG. 4 is a conceptual view illustrating a flip chip type semiconductor light-emitting device in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light-emitting device in FIG. 3A, and FIGS. 5A through 5C are conceptual views illustrating various forms for implementing colors in connection with a flip chip type semiconductor light-emitting device.

According to the drawings in FIGS. 2, 3A and 3B, there is illustrated a display device 100 using a passive matrix (PM) type semiconductor light-emitting device as a display device 100 using a semiconductor light-emitting device. However, an example described below may also be applicable to an active matrix (AM) type semiconductor light-emitting device.

The display device 100 may include a substrate 110, a first electrode 120, a conductive adhesive layer 130, a second electrode 140, and a plurality of semiconductor light-emitting devices 150.

The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light-emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in this example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light-emitting device 150 is connect thereto in a flip chip form with the application of heat and pressure, the semiconductor light-emitting device 150 is electrically connected to the first electrode 120 and second electrode 140.

Referring to FIG. 4, the semiconductor light-emitting device may be a flip chip type semiconductor light-emitting device.

For example, the semiconductor light-emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light-emitting devices 150. For example, the left and right p-type electrodes of the semiconductor light-emitting devices around the auxiliary electrode may be electrically connected to one auxiliary electrode.

More specifically, the semiconductor light-emitting device 150 is pressed into the conductive adhesive layer 130, and through this, only a portion between the p-type electrode 156 and auxiliary electrode 170 of the semiconductor light-emitting device 150 and a portion between the n-type electrode 152 and second electrode 140 of the semiconductor light-emitting device 150 have conductivity, and the remaining portion does not have conductivity since there is no push-down of the semiconductor light-emitting device. As described above, the conductive adhesive layer 130 may form an electrical connection as well as allow a mutual coupling between the semiconductor light-emitting device 150 and the auxiliary electrode 170 and between the semiconductor light-emitting device 150 and the second electrode 140.

Furthermore, a plurality of semiconductor light-emitting devices 150 constitute a light-emitting array, and a phosphor layer 180 is formed on the light-emitting array.

The light emitting device array may include a plurality of semiconductor light-emitting devices with different self-luminance values. Each of the semiconductor light-emitting devices 150 constitutes a sub-pixel, and is electrically connected to the first electrode 120. For example, there may exist a plurality of first electrodes 120, and the semiconductor light-emitting devices are arranged in several rows, for instance, and each row of the semiconductor light-emitting devices may be electrically connected to any one of the plurality of first electrodes.

Furthermore, the semiconductor light-emitting devices may be connected in a flip chip form, and thus semiconductor light-emitting devices grown on a transparent dielectric substrate. Furthermore, the semiconductor light-emitting devices may be nitride semiconductor light-emitting devices, for instance. The semiconductor light-emitting device 150 has an excellent luminance characteristic, and thus it may be possible to configure individual sub-pixels even with a small size thereof.

According to the drawing, a partition wall 190 may be formed between the semiconductor light-emitting devices 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light-emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light-emitting device 150. For example, the semiconductor light-emitting device 150 is a blue semiconductor light-emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light-emitting device 151 at a location implementing a red sub-pixel, and a green phosphor 182 capable of converting blue light into green (G) light may be deposited on the blue semiconductor light-emitting device 151 at a location implementing a green sub-pixel. Furthermore, only the blue semiconductor light-emitting device 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light-emitting device 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
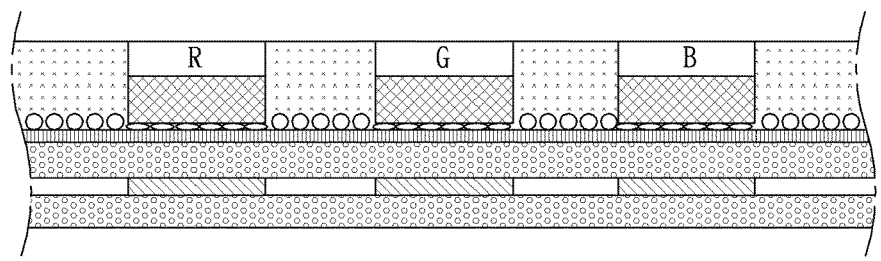
FIGS. 5A through 5C are conceptual views illustrating various forms for implementing colors in connection with a flip-chip type semiconductor light-emitting device.

Referring to FIG. 5A, each of the semiconductor light-emitting devices 150 may be implemented with a high-power light emitting device that emits various lights including blue in which gallium nitride (GaN) is mostly used, and indium (In) and or aluminum (Al) are added thereto.

In this case, the semiconductor light-emitting device 150 may be red, green and blue semiconductor light-emitting devices, respectively, to implement each sub-pixel. For instance, red, green and blue semiconductor light-emitting devices (R, G, B) are alternately disposed, and red, green and blue sub-pixels implement one pixel by means of the red, green and blue semiconductor light-emitting devices, thereby implementing a full color display.

Figure 5B:
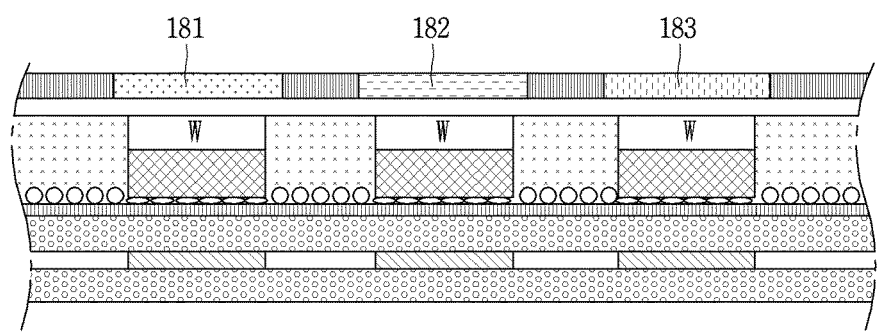

Referring to FIG. 5B, the semiconductor light-emitting device may have a white light emitting device (W) provided with a yellow phosphor layer for each element. In this case, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
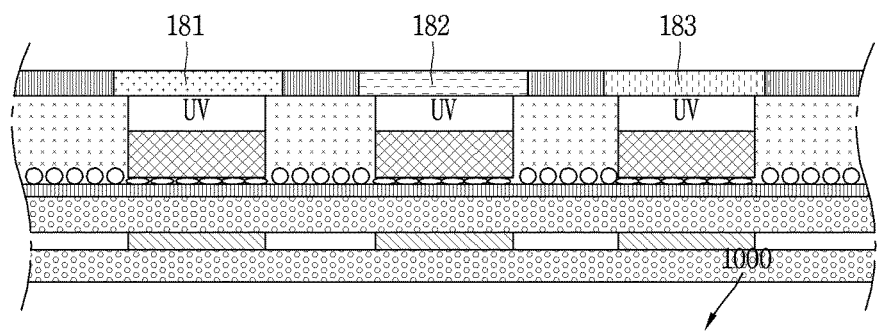

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light-emitting device can be used over the entire region up to ultra violet (UV) as well as visible light, and may be extended to a form of semiconductor light-emitting device in which ultra violet (UV) can be used as an excitation source.

Taking the present example into consideration again, the semiconductor light-emitting device 150 is placed on the conductive adhesive layer 130 to configure a sub-pixel in the display device. The semiconductor light-emitting device 150 may have excellent luminance characteristics, and thus it may be possible to configure individual sub-pixels even with a small size thereof. The size of the individual semiconductor light-emitting device 150 may be less than 80 μm in the length of one side thereof, and formed with a rectangular or square shaped element. In case of a rectangular shaped element, the size thereof may be less than 20×80 μm.

Furthermore, even when a square shaped semiconductor light-emitting device 150 with a length of side of 10 μm is used for a sub-pixel, it will exhibit a sufficient brightness for implementing a display device. Accordingly, for example, in case of a rectangular pixel in which one side of a sub-pixel is 600 μm in size, and the remaining one side thereof is 300 μm, a relative distance between the semiconductor light-emitting devices becomes sufficiently large. Accordingly, in this case, it may be possible to implement a flexible display device having a HD image quality.

A display device using the foregoing semiconductor light-emitting device will be fabricated by a new type of fabrication method. Hereinafter, the fabrication method will be described with reference to FIG. 6.

Figure 6:
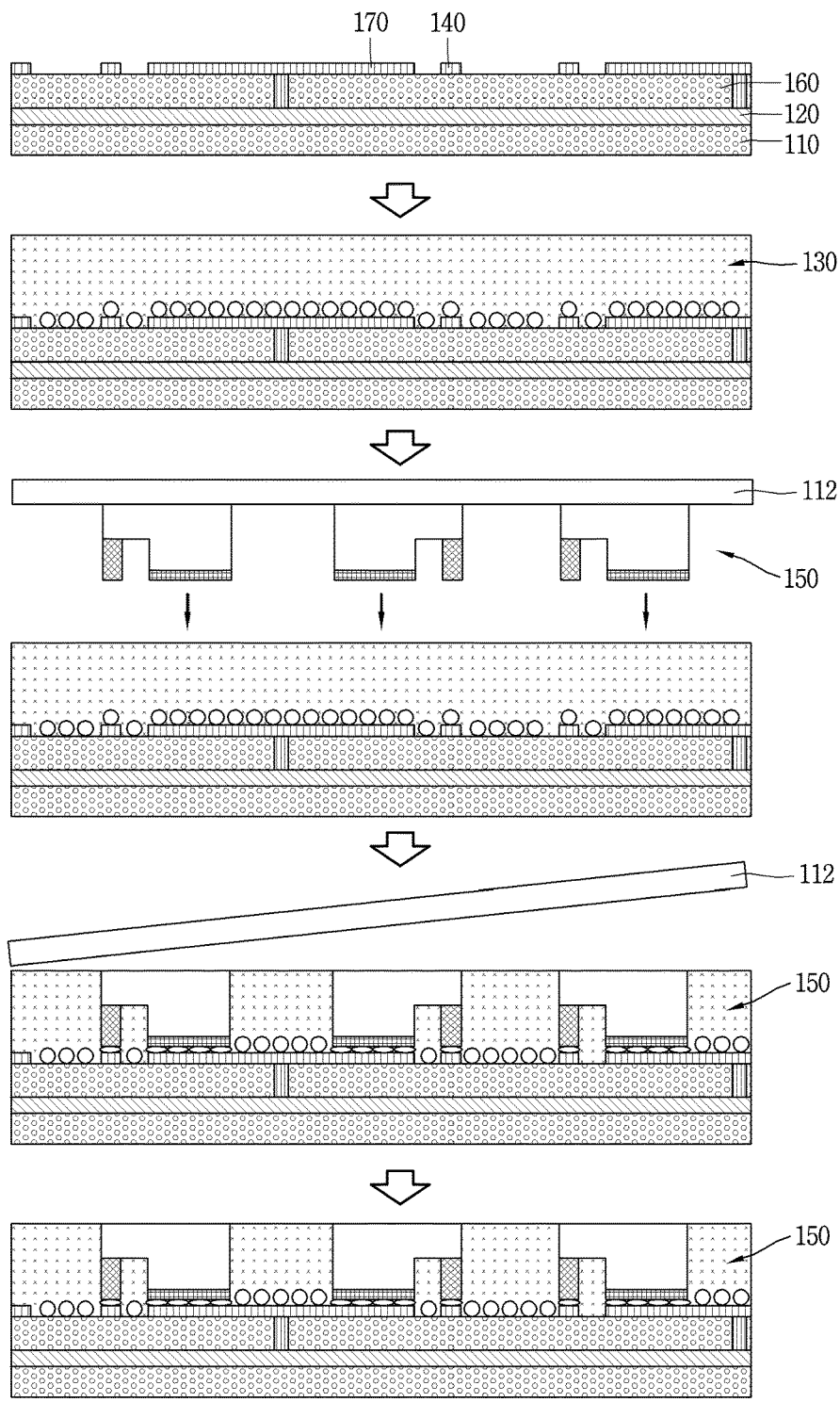
FIG. 6 is cross-sectional views illustrating a fabrication method of a display device using a semiconductor light-emitting device according to the present disclosure.

FIG. 6 is cross-sectional views illustrating a fabrication method of a display device using a semiconductor light-emitting device according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light-emitting devices 150 corresponding to the location of the auxiliary electrodes 170 and second electrodes 140 and constituting individual pixels is disposed such that the semiconductor light-emitting device 150 faces the auxiliary electrode 170 and second electrode 140.

In this case, the second substrate 112 as a growth substrate for growing the semiconductor light-emitting device 150 may be a sapphire substrate or silicon substrate.

The semiconductor light-emitting device may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light-emitting device 150 and the auxiliary electrode 170 and second electrode 140 may have conductivity due to the characteristics of an anisotropic conductive film having conductivity by thermal compression, thereby allowing the electrodes and semiconductor light-emitting device 150 to be electrically connected to each other. At this time, the semiconductor light-emitting device 150 may be inserted into the anisotropic conductive film, thereby forming a partition wall between the semiconductor light-emitting devices 150.

Next, the second substrate 112 is removed. For example, the second substrate 112 may be removed using, a laser lift-off (LLO) or chemical lift-off (CLO) method.

Finally, the second substrate 112 is removed to expose the semiconductor light-emitting devices 150 to the outside. Silicon oxide (SiOx) or the like may be coated on the wiring substrate coupled to the semiconductor light-emitting device 150 to form a transparent insulating layer (not shown).

Furthermore, it may further include the process of forming a phosphor layer on one surface of the semiconductor light-emitting device 150. For example, the semiconductor light-emitting device 150 may be a blue semiconductor light-emitting device for emitting blue (B) light, and red or green phosphor for converting the blue (B) light into the color of the sub-pixel may form a layer on one surface of the blue semiconductor light-emitting device.

The fabrication method or structure of a display device using the foregoing semiconductor light-emitting device may be modified in various forms. For such an example, the foregoing display device may be applicable to a vertical semiconductor light-emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
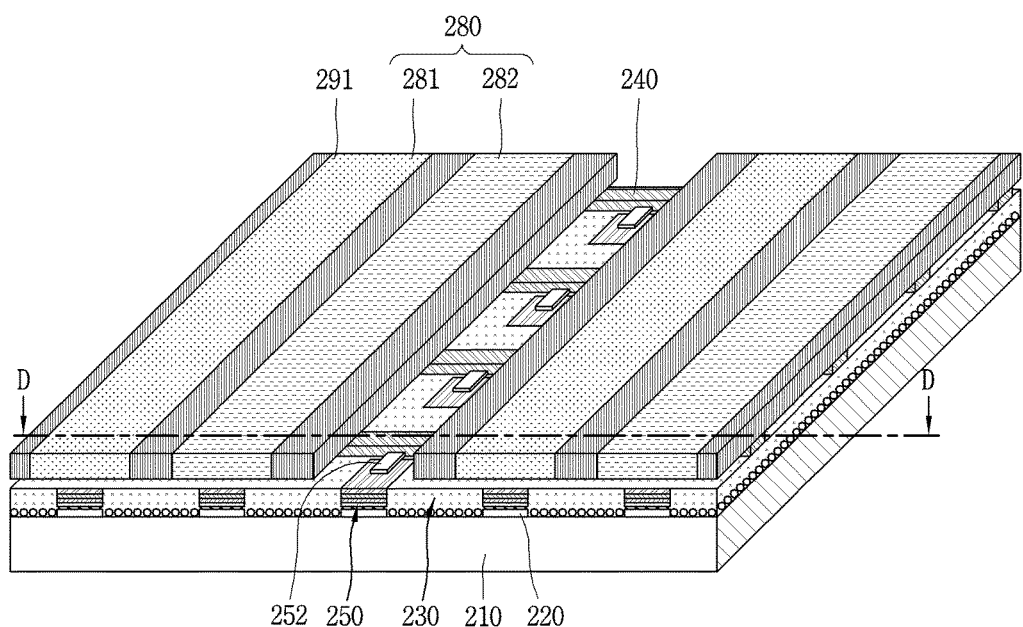
FIG. 7 is a perspective view illustrating a display device using a semiconductor light-emitting device according to another embodiment of the present disclosure.
Figure 8:
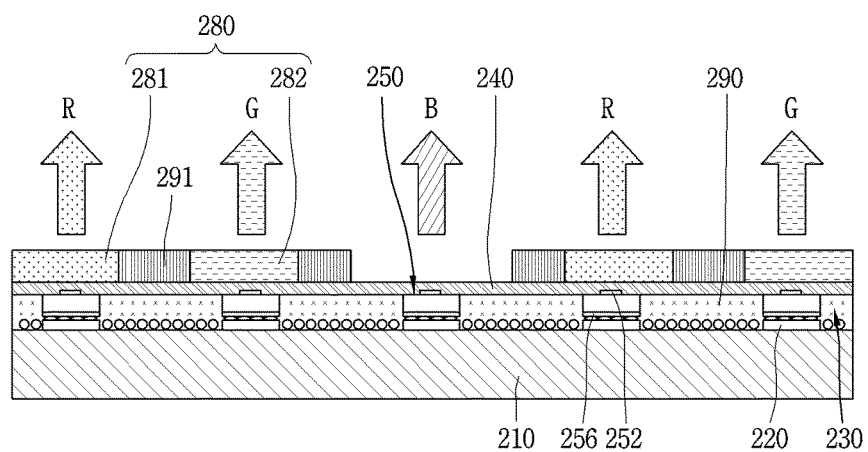
FIG. 8 is a cross-sectional view taken along line D-D in FIG. 7.
Figure 9:
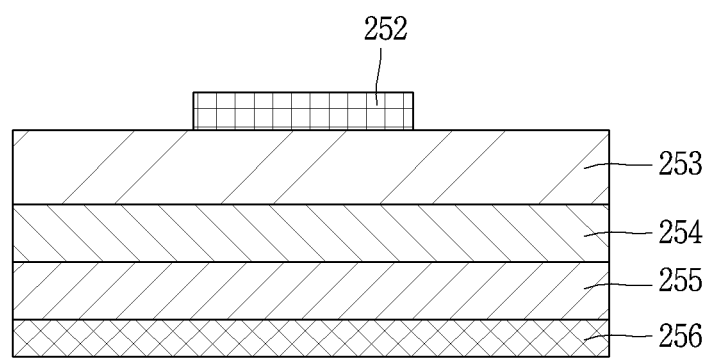
FIG. 9 is a conceptual view illustrating a vertical type semiconductor light-emitting device in FIG. 8.

FIG. 7 is a perspective view illustrating a display device using a semiconductor light-emitting device according to another embodiment of the present disclosure. FIG. 8 is a cross-sectional view taken along line C-C in FIG. 7, and FIG. 9 is a conceptual view illustrating a vertical type semiconductor light-emitting device in FIG. 8.

According to the drawings, the display device may be display device using a passive matrix (PM) type of vertical semiconductor light-emitting device.

The display device may include a substrate 210, a first electrode 220, a conductive adhesive layer 230, a second electrode 240 and a plurality of semiconductor light-emitting devices 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light-emitting device 250 thereto, the semiconductor light-emitting device 250 is electrically connected to the first electrode 220. At this time, the semiconductor light-emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light-emitting device 250 and the first electrode 220.

In this manner, the semiconductor light-emitting device 250 is placed on the conductive adhesive layer 230, thereby configuring a separate sub-pixel in the display device. The semiconductor light-emitting device 250 may have excellent luminance characteristics, and thus it may be possible to configure individual sub-pixels even with a small size thereof. The size of the individual semiconductor light-emitting device 250 may be less than 80 μm in the length of one side thereof, and formed with a rectangular or square shaped element. In case of a rectangular shaped element, the size thereof may be less than 20×80 μm.

The semiconductor light-emitting device 250 may be a vertical structure.

A plurality of second electrodes 240 disposed in a direction of crossing the length direction of the first electrode 220, and electrically connected to the vertical semiconductor light-emitting device 250 may be located between vertical semiconductor light-emitting devices.

Referring to FIG. 9, the vertical semiconductor light-emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light-emitting device 250, thereby providing a great advantage capable of reducing the chip size.

Referring again to FIG. 8, a phosphor layer 280 may be formed on one surface of the semiconductor light-emitting device 250. For example, the semiconductor light-emitting device 250 is a blue semiconductor light-emitting device 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light-emitting device 251 at a location implementing a red sub-pixel, and a green phosphor 282 capable of converting blue light into green (G) light may be deposited on the blue semiconductor light-emitting device 251 at a location implementing a green sub-pixel. Furthermore, only the blue semiconductor light-emitting device 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which a flip chip type light emitting device is applied.

Taking the present embodiment into consideration again, the second electrode 240 is located between the semiconductor light-emitting devices 250, and electrically connected to the semiconductor light-emitting devices 250. For example, the semiconductor light-emitting devices 250 may be disposed in a plurality of rows, and the second electrode 240 may be located between the rows of the semiconductor light-emitting devices 250.

Since a distance between the semiconductor light-emitting devices 250 constituting individual pixels is sufficiently large, the second electrode 240 may be located between the semiconductor light-emitting devices 250.

The second electrode 240 may be formed with a bar-shaped electrode elongated in one direction, and disposed in a perpendicular direction to the first electrode.

Furthermore, the second electrode 240 may be electrically connected to the semiconductor light-emitting device 250 by a connecting electrode protruded from the second electrode 240. More specifically, the connecting electrode may be an n-type electrode of the semiconductor light-emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light-emitting device 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light-emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light-emitting device 250, the ITO material has a problem of bad adhesiveness with an n-type semiconductor. Accordingly, the second electrode 240 may be placed between the semiconductor light-emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light-emitting devices 250. In other words, the partition wall 290 may be disposed between the vertical semiconductor light-emitting devices 250 to isolate the semiconductor light-emitting device 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light-emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this case, the partition wall 290 may include a black or white insulator according to the purpose of the display device.

If the second electrode 240 is precisely located on the conductive adhesive layer 230 between the semiconductor light-emitting devices 250, the partition wall 290 may be located between the semiconductor light-emitting device 250 and second electrode 240. Accordingly, individual sub-pixels may be configured even with a small size using the semiconductor light-emitting device 250, and a distance between the semiconductor light-emitting devices 250 may be relatively sufficiently large to place the second electrode 240 between the semiconductor light-emitting devices 250, thereby having the effect of implementing a flexible display device having a HD image quality.

Furthermore, according to the drawing, a black matrix 291 may be disposed between each phosphor layer to enhance contrast. In other words, the black matrix 291 can enhance the contrast of luminance.

As described above, the semiconductor light-emitting device 250 is located on the conductive adhesive layer 230, thereby constituting individual pixels on the display device. The semiconductor light-emitting device 250 may have excellent luminance characteristics, and thus it may be possible to configure individual sub-pixels even with a small size thereof. As a result, it may be possible to implement a full color display in which the sub-pixels of red (R), green (G) and blue (B) implement one pixel by means of the semiconductor light-emitting device.

In a display device using the foregoing semiconductor light-emitting device of the present disclosure, when a flip chip type is applied thereto, the first and second electrodes are disposed on the same plane, thereby causing a problem in which it is difficult to realize a fine pitch. Hereinafter, a display device to which a flip chip type light emitting device according to another embodiment of the present disclosure capable of solving such a problem is applied will be described.

Figure 10:
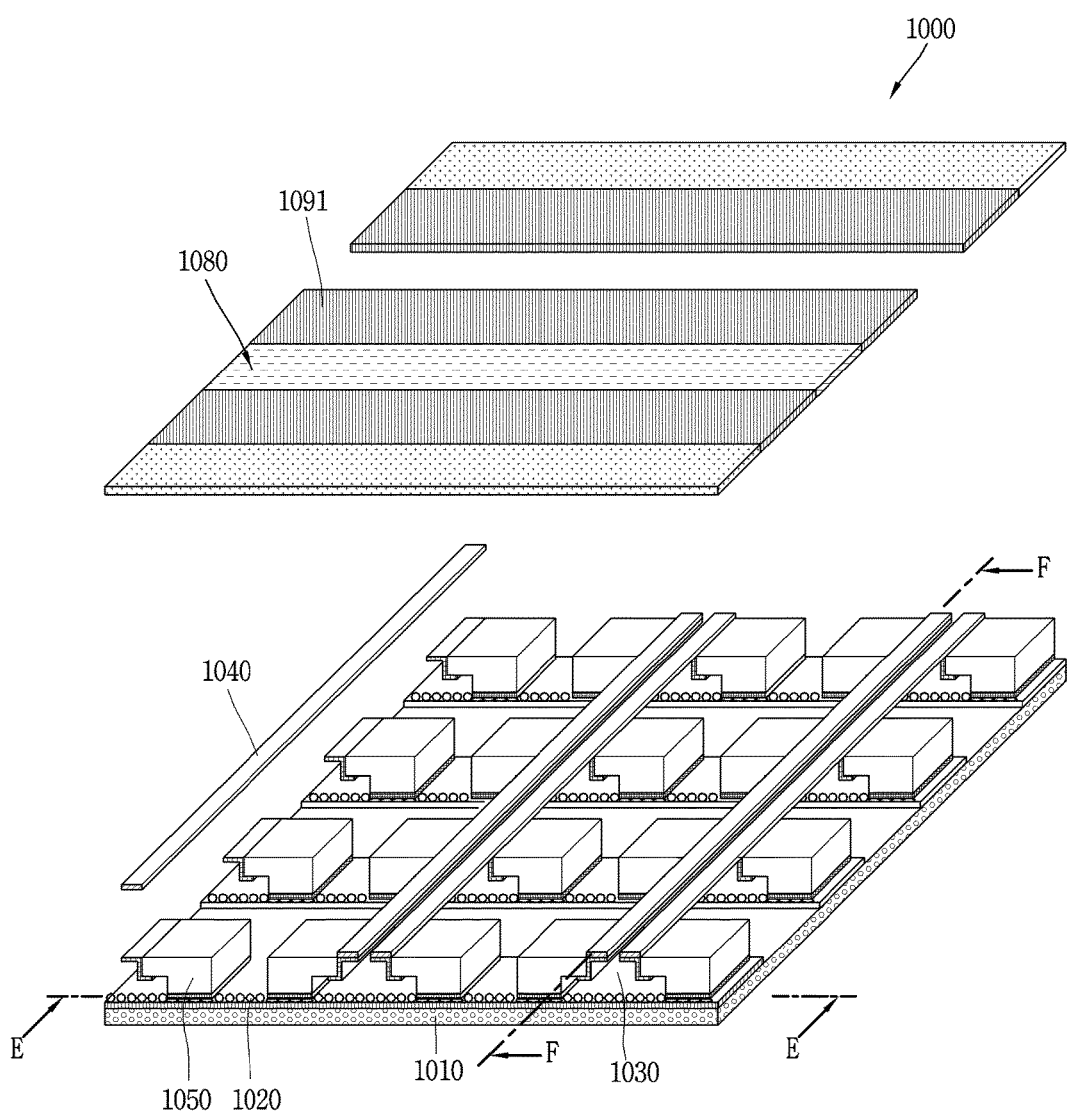
FIG. 10 is an enlarged view of portion "A" in FIG. 1 for explaining another embodiment of the present disclosure to which a semiconductor light-emitting device having a new structure is applied.

FIG. 10 is an enlarged view of portion "A" in FIG. 1 for explaining another embodiment of the present disclosure to which a semiconductor light-emitting device having a new structure is applied. Furthermore, FIG. 11A is a cross-sectional view taken along line E-E in FIG. 10, FIG. 11B is a cross-sectional view taken along line F-F in FIG. 11, and FIG. 12 is a conceptual view illustrating a flip chip type semiconductor light-emitting device in FIG. 11A.

Figure 11A:
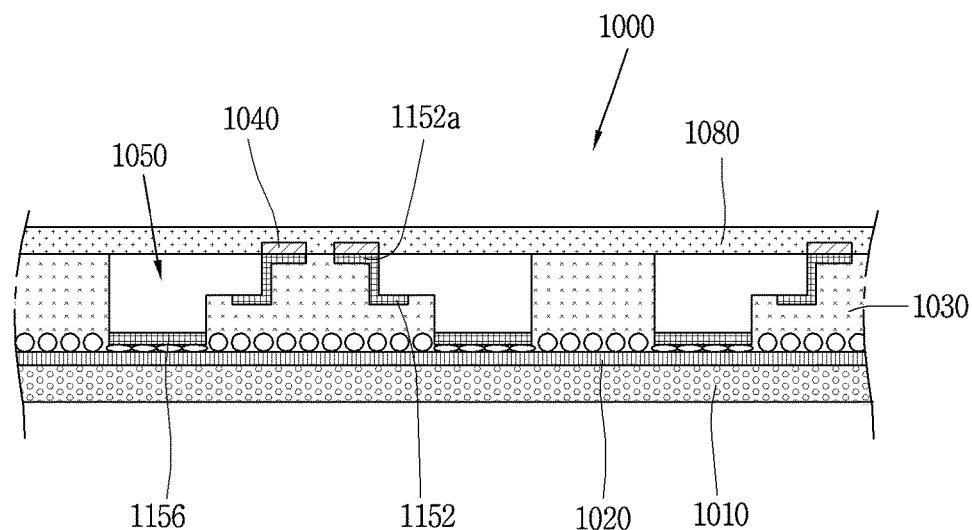
FIG. 11A is a cross-sectional view taken along line E-E in FIG. 10.
Figure 11B:
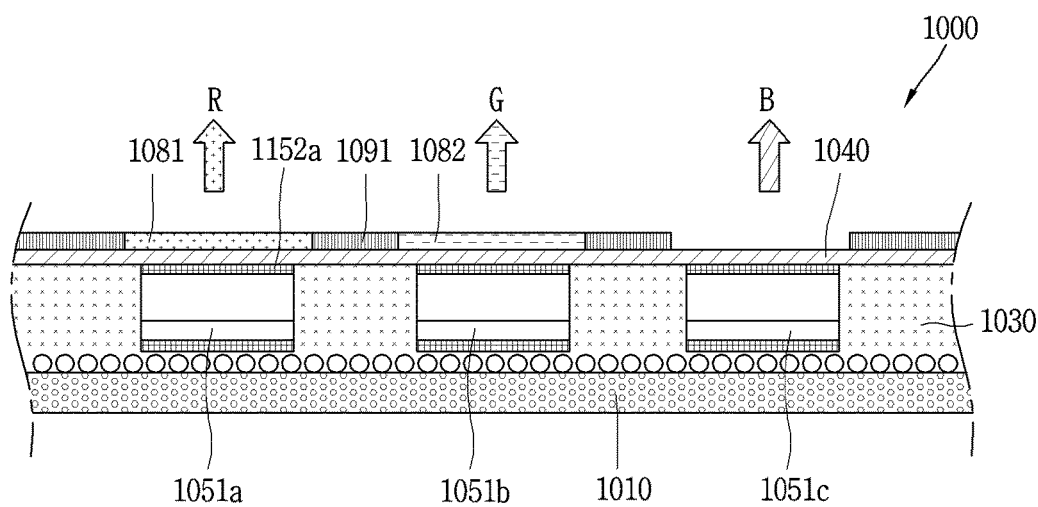
FIG. 11B is a cross-sectional view taken along line F-F in FIG. 11.
Figure 12:
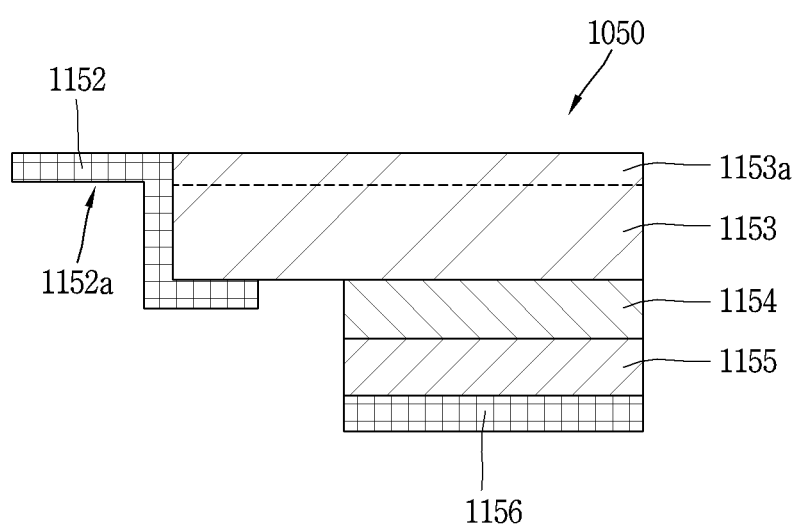
FIG. 12 is a conceptual view illustrating a flip chip type semiconductor light-emitting device in FIG. 11A.

According to the drawings in FIGS. 10, 11A and 11B, there is illustrated a display device 1000 using a passive matrix (PM) type semiconductor light-emitting device as a display device 1000 using a semiconductor light-emitting device. However, an example described below may also be applicable to an active matrix (AM) type semiconductor light-emitting device.

The display device 1000 may include a substrate 1010, a first electrode 1020, a conductive adhesive layer 1030, a second electrode 1040, and a plurality of semiconductor light-emitting devices 1050. Here, the first electrode 1020 and the second electrode 1040 may respectively include a plurality of electrode lines.

The substrate 1010 as a wiring substrate disposed with the first electrode 1020 may include polyimide (PI) to implement a flexible display device. In addition, any one may be used if it is an insulating and flexible material.

The first electrode 1020 may be located on the substrate 1010, and formed with a bar-shaped electrode elongated in one direction. The first electrode 1020 may be formed to perform the role of a data electrode.

The conductive adhesive layer 1030 is formed on the substrate 1010 located with the first electrode 1020. Similarly to a display device to which the foregoing flip chip type light emitting device is applied, the conductive adhesive layer 1030 may be an anisotropic conductive film (ACF), an anisotropic conductive paste, a solution containing conductive particles, and the like. However, in the present embodiment, the conductive adhesive layer 1030 may be replaced with an adhesive layer. For example, when the first electrode 1020 is not located on the substrate 1010 but formed integrally with the conductive electrode of the semiconductor light-emitting device, the adhesive layer may not need to have conductivity.

A plurality of second electrodes 1040 disposed in a direction of crossing the length direction of the first electrode 1020, and electrically connected to the semiconductor light-emitting device 1050 may be located between the semiconductor light-emitting devices.

According to the drawing, the second electrode 1040 may be located on the conductive adhesive layer 1030. In other words, the conductive adhesive layer 1030 is disposed between the wiring substrate and the second electrode 1040. The second electrode 1040 may be electrically connected by contact with the semiconductor light-emitting device 1050.

A plurality of semiconductor light-emitting devices 1050 are coupled to the conductive adhesive layer 1030, and electrically connected to the first electrode 1020 and the second electrode 1040 by the foregoing structure.

According to circumstances, a transparent insulating layer (not shown) containing silicon oxide (SiOx) may be formed on the substrate 1010 formed with the semiconductor light-emitting device 1050. When the transparent insulating layer is formed and then the second electrode 1040 is placed thereon, the second electrode 1040 may be located on the transparent insulating layer. Furthermore, the second electrode 1040 may be formed to be separated from the conductive adhesive layer 1030 or transparent insulating layer.

As shown in the drawing, the plurality of semiconductor light-emitting devices 1050 may form a plurality of columns in a direction parallel to a plurality of electrode lines provided in the first electrode 1020. However, the present disclosure is not necessarily limited thereto. For example, the plurality of semiconductor light-emitting devices 1050 may form a plurality of columns along the second electrode 1040.

Moreover, the display device 1000 may further include a phosphor layer 1080 formed on one surface of the plurality of semiconductor light-emitting devices 1050. For example, the semiconductor light-emitting device 1050 is a blue semiconductor light-emitting device that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light may be deposited on the blue semiconductor light-emitting device 1051*a* at a location implementing a red sub-pixel, and a green phosphor 1082 capable of converting blue light into green (G) light may be deposited on the blue semiconductor light-emitting device 1051*b* at a location implementing a green sub-pixel. Furthermore, only the blue semiconductor light-emitting device 1051*c* may be solely used at a location implementing a blue sub-pixel. In this case, the red (R), green (G) and blue (B) sub-pixels may implement one pixel. More specifically, one color phosphor may be deposited along each line of the first electrode 1020. Accordingly, one line on the first electrode 1020 may be an electrode controlling one color. In other words, red (R), green (B) and blue (B) may be sequentially disposed along the second electrode 1040, thereby implementing sub-pixels. However, the present disclosure may not be necessarily limited to this, and the semiconductor light-emitting device 1050 may be combined with a quantum dot (QD) instead of a phosphor to implement sub-pixels that emit red (R), green (G) and blue (B).

On the other hand, in order to improve the contrast of the phosphor layer 1080, the display device may further include a black matrix 1091 disposed between each phosphor. The black matrix 1091 may be formed in such a manner that a gap is formed between the phosphor dots and a black material fills the gap. Through this, the black matrix 1091 may improve contrast between light and dark while absorbing external light reflection. The black matrix 1091 is located between respective phosphor layers along the first electrode 1020 in a direction in which the phosphor layers 1080 are layered. In this case, a phosphor layer may not be formed at a position corresponding to the blue semiconductor light-emitting device 1051, but the black matrix 1091 may be respectively formed at both sides thereof by interposing a space that does not have the blue light emitting device 1051*c* therebetween.

Meanwhile, referring to the semiconductor light-emitting device 1050 according to the present example, the electrodes may be disposed in an upward/downward direction in the semiconductor light-emitting device 1050 in the present embodiment, thereby having a great advantage capable of reducing the chip size. However, the electrode may be disposed on the top and the bottom, but the semiconductor light-emitting device may be a flip chip type semiconductor light-emitting device.

Referring to FIG. 12, the semiconductor light-emitting device 1050 includes a first conductive electrode 1156, a first conductive semiconductor layer 1155 formed with the first conductive electrode 1156, an active layer 1154 formed on the first conductive semiconductor layer 1155, a second conductive semiconductor layer 1153 formed on the active layer 1154, and a second conductive electrode 1152 formed on the second conductive semiconductor layer 1153.

More specifically, the first conductive electrode 1156 and the first conductive semiconductor layer 1155 may be a p-type electrode and a p-type semiconductor layer, respectively, and the second conductive electrode 1152 and the second conductive semiconductor layer 1153 may be an n-type electrode and an n-type semiconductor layer, respectively. However, the present disclosure is not limited thereto, and the first conductive type may be n-type and the second conductive type may be p-type.

More specifically, the first conductive electrode 1156 is formed on one surface of the first conductive semiconductor layer 1155, and the active layer 1154 is formed on the other surface of the first conductive semiconductor layer 1155 and one surface of the second conductive semiconductor layer 1153, and the second conductive electrode 1152 is formed on one surface of the second conductive semiconductor layer 1153.

In this case, the second conductive electrode is disposed on one surface of the second conductive semiconductor layer 1153, and an undoped semiconductor layer 1153*a* is formed on the other surface of the second conductive semiconductor layer 1153.

Referring to FIG. 12 together with FIGS. 10 through 11B, one surface of the second conductive semiconductor layer may be a surface closest to the wiring substrate, and the other surface of the second conductive semiconductor layer may be a surface farthest from the wiring substrate.

Furthermore, the first conductive electrode 1156 and the second conductive electrode 1152 may have a height difference from each other in width and vertical directions (or thickness direction) at positions spaced apart along the width direction of the semiconductor light-emitting device.

The second conductive electrode 1152 is formed, on the second conductive semiconductor layer 1153 using the height difference, but disposed adjacent to the second electrode 1040 located at an upper side of the semiconductor light-emitting device. For example, at least part of the second conductive electrode 1152 may protrude from a lateral surface of the second conductive semiconductor layer 1153 (or a lateral surface of the undoped semiconductor layer 1153*a*). As described above, since the second conductive electrode 1152 protrudes from the lateral surface, the second conductive electrode 1152 may be exposed to an upper side of the semiconductor light-emitting device. Through this, the second conductive electrode 1152 is disposed at a position overlapping the second electrode 1040 disposed at an upper side of the conductive adhesive layer 1030.

More specifically, the semiconductor light-emitting device includes a protruding portion 1152*a* extending from the second conductive electrode 1152, and protruding from a lateral surface of the plurality of semiconductor light-emitting devices. In this case, referring to the protruding portion 1152*a* as a reference, the first conductive electrode 1156 and the second conductive electrode 1152 are disposed at positions spaced apart along the protruding direction of the protruding portion 1152a, and may be expressed such that they are formed to have a height difference from each other in a direction perpendicular to the protruding direction.

The protruding portion 1152a extends laterally from one surface of the second conductive semiconductor layer 1153, and extends to an upper surface of the second conductive semiconductor layer 1153, and more specifically, to the undoped semiconductor layer 1153a. The protruding portion 1152a protrudes along the width direction from a lateral surface of the undoped semiconductor layer 1153a. Accordingly, the protruding portion 1152a may be electrically connected to the second electrode 1040 on the opposite side of the first conductive electrode with respect to the second conductive semiconductor layer.

A structure including the protruding portion 1152a may be a structure capable of using the above-described horizontal semiconductor light-emitting device and vertical semiconductor light-emitting device. On the other hand, fine grooves may be formed by roughing on an upper surface farthest from the first conductive electrode 1156 on the undoped semiconductor layer 1153a.

According to the above-described display devices (FIGS. 2 and 10), light emitted from the semiconductor light-emitting devices is excited using phosphors to implement red (R) and green (G). In this case, the semiconductor light-emitting device includes a p-type semiconductor layer, an active layer formed on the p-type semiconductor layer, and an n-type semiconductor layer formed on the active layer. In this case, considering a process of manufacturing the semiconductor light-emitting device, a p-type semiconductor layer, an active layer and an n-type semiconductor layer are epitaxially grown on the substrate, and the process is subjected to a mesa etching process for etching the p-type semiconductor layer and the active layer until the n-type semiconductor layer is exposed, and an isolation process for etching the n-type semiconductor layer to form a plurality of semiconductor light-emitting devices. In other words, a light emitting region and a p-contact region are formed by the mesa etching, and an n-contact region is formed by the isolation process.

Then, a passivation layer is formed using an insulator material such as $SiO_2$ or SiN to isolate the p-type semiconductor and the n-type semiconductor, and a metal film for P- and N-electrodes for current injection is deposited. In this case, since the isolation process is continued after the mesa etching process, the manufacturing process becomes complicated.

In the present disclosure, a semiconductor light-emitting device having a new structure capable of solving such a problem will be presented. Hereinafter, a display device to which a semiconductor light-emitting device having a new structure is applied and a method of manufacturing the same will be described.

Figure 13:
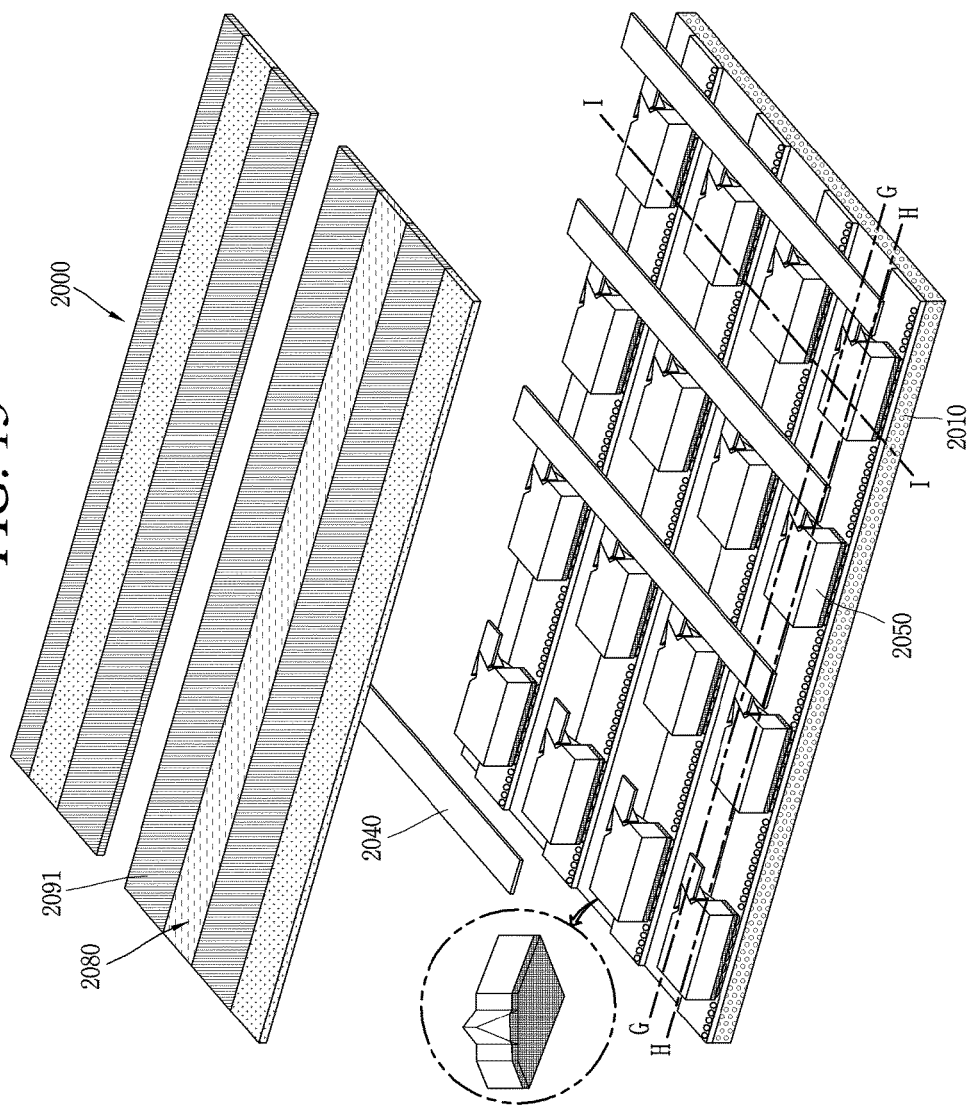
FIG. 13 is an enlarged view of portion "A" in FIG. 1 for explaining another embodiment of the present disclosure.
Figure 14:
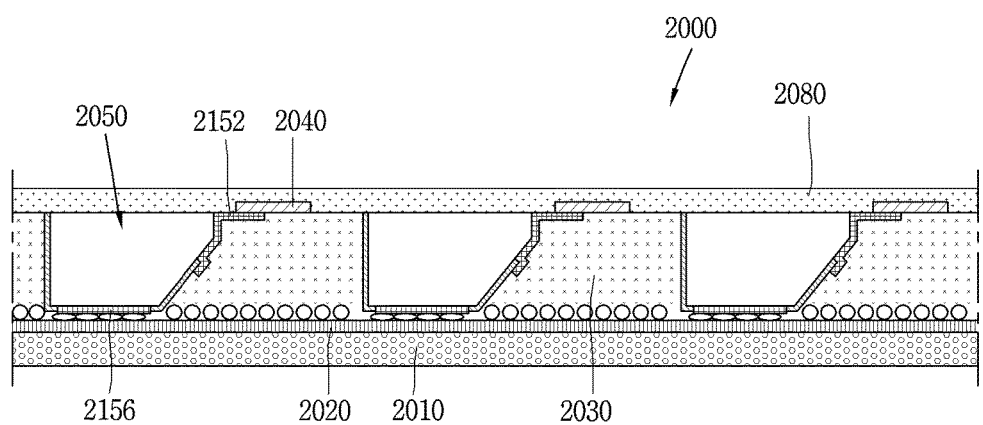
FIG. 14 is a cross-sectional view taken along line G-G in FIG. 13.
Figure 15:
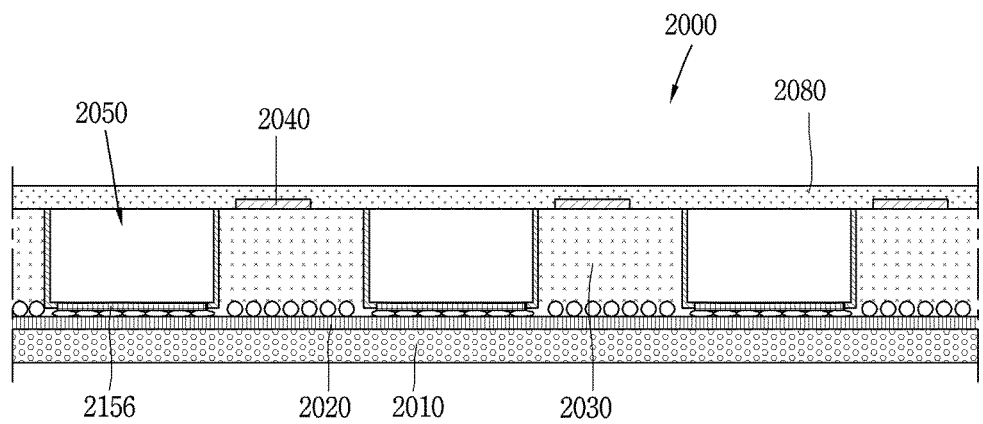
FIG. 15 is a cross-sectional view taken along line H-H in FIG. 13.
Figure 16:
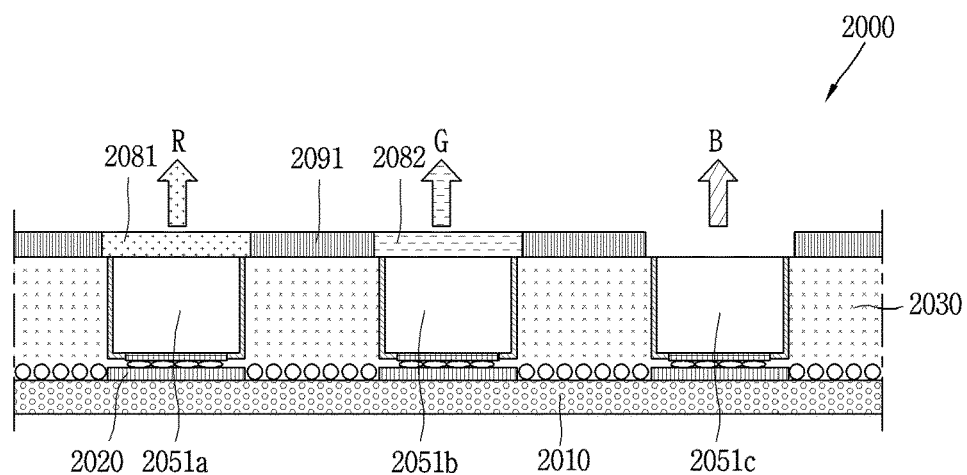
FIG. 16 is a cross-sectional view taken along line I-I in FIG. 13.
Figure 17:
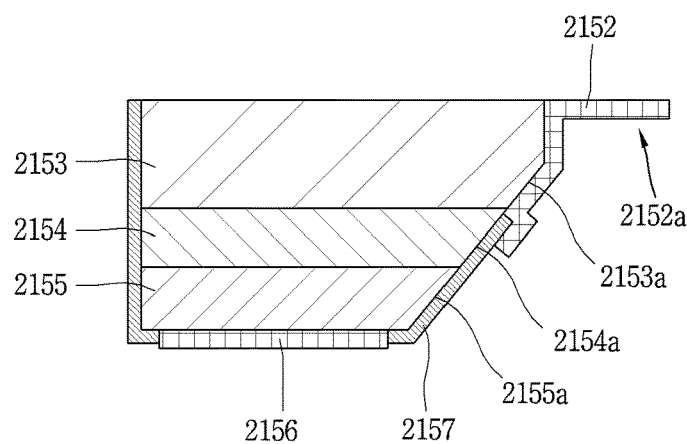
FIG. 17 is a conceptual view illustrating a semiconductor light-emitting device in FIG. 13.

FIG. 13 is an enlarged view of portion "A" in FIG. 1 for explaining another embodiment of the present disclosure, and FIG. 14 is a cross-sectional view taken along line G-G in FIG. 13, FIG. 15 is a cross-sectional view taken along line H-H in FIG. 13, and FIG. 16 is a cross-sectional view taken along line I-I in FIG. 13, and FIG. 17 is a conceptual view illustrating a semiconductor light-emitting device in FIG. 13.

According to the drawings of FIGS. 13, 14, 15, 16 and 17, in a display device described with reference to FIGS. 10 through 12 as a display device 2000 using semiconductor light-emitting devices, a case where semiconductor light-emitting devices having a new structure is applied the case where it is applied will be illustrated.

In the present example to be described below, the same or similar reference numerals are designated to the same or similar components as those of the example described above with reference to FIGS. 10 through 12, and the description thereof will be substituted by the earlier description. For example, the display device 2000 includes a substrate 2010, a first electrode 2020, a second electrode 2040, a conductive adhesive layer 2030, a phosphor layer 2080, and a plurality of semiconductor light-emitting devices 2050, and the descriptions thereof will be substituted by the description with reference to FIGS. 10 through 12 as described above.

Referring to these drawings, the semiconductor light-emitting device includes a first conductive semiconductor layer 2155 and a second conductive semiconductor layer 2153 overlapping with the first conductive semiconductor layer 2155. In this case, the second conductive semiconductor layer 2153 has upper, lower, and lateral surfaces, and the lower surface thereof is disposed on the first conductive semiconductor layer to face the first conductive semiconductor layer. Furthermore, the semiconductor light-emitting device may include an active layer 2154 formed between the second conductive semiconductor layer 2153 and the first conductive semiconductor layer 2153.

In addition, the semiconductor light-emitting device may include a first conductive electrode 2156 electrically connected to the first conductive semiconductor layer 2155, and a second conductive electrode 2156 electrically connected to the second conductive semiconductor layer 2153.

On the other hand, the first conductive electrode 2156 and the first conductive semiconductor layer 2155 may be a p-type electrode and a p-type semiconductor layer, respectively, and the second conductive electrode 2152 and the second conductive semiconductor layer 2153 may be an n-type electrode and an n-type semiconductor layer, respectively. However, the present disclosure is not limited thereto, and the first conductive type may be n-type and the second conductive type may be p-type.

According to the drawing, the second conductive semiconductor layer 2153 has an inclined portion inclined with respect to a lateral surface of the second conductive semiconductor layer 2153, and the second conductive electrode 2152 is formed to cover the inclined portion. In addition, the inclined portion extends to the first conductive semiconductor layer 2155. In this case, a portion corresponding to the first conductive semiconductor layer 2155 is a first inclined portion 2155a, and a portion corresponding to the second conductive semiconductor layer 2153 is a second inclined portion 2153a.

In a display device described with reference to FIGS. 10 through 12, the semiconductor light-emitting device is formed without the inclined portion. It is because a current manufacturing method is configured with a process of etching the first conductive semiconductor layer during a mesa etching process, and etching the second conductive semiconductor layer during the subsequent isolation process. On the contrary, in this example, it is proposed a structure in which the first conductive semiconductor layer and the second conductive semiconductor layer are etched by a single etching process using the inclined portion, and it may be defined as an integrated structure of mesa and isolation. On the other hand, the active layer 2154 may include a second inclined portion 2153a and a third inclined portion 2154a extended therefrom.

In addition, in the integrated structure, the first inclined portion 2155a and the second inclined portion 2153a are formed at one corner of the semiconductor light-emitting device together with the third inclined portion 2154a. For example, the first inclined portion 2155a and the second inclined portion 2153a together with the third inclined portion 2154a form a triangle at the one corner.

In FIG. 13, the first conductive semiconductor layer 2155 and the second conductive semiconductor layer 2153 are formed such that one corner of a rectangle is changed to a diagonal side except for the triangle, and only one side thereof may form an obtuse angle with respect to the other sides at both ends, and the remaining sides thereof may form a pentagon perpendicular to each other. The triangle may be disposed on the one side. In this case, the remaining four sides of the first conductive semiconductor layer 2155 and the corresponding four sides of the second conductive semiconductor layer 2153 may be disposed at positions where they overlap with each other. According to such a structure, the sides of the p-type semiconductor layer may be positioned in the same line as the sides of the n-type semiconductor layer, and a size of the p-type semiconductor layer may be increased. For the same reason, the active layer may also form the pentagon, and thus an area of the light emitting region increases.

According to the drawing, the second conductive electrode 2152 is deposited on the second conductive semiconductor layer 2153 in the second inclined portion 2153a. Furthermore, the second conductive electrode 2152 may extend from the second inclined portion 2153a to the lateral surface, and protrude from the lateral surface in a direction away from the second conductive semiconductor layer 2153.

In this case, an undoped semiconductor layer (not shown) may be formed on a lower surface of the second conductive semiconductor layer 2153. In addition, according to the drawing, a lower surface of the second conductive semiconductor layer may be a surface closest to the wiring substrate, and the an upper surface of the second conductive semiconductor layer may be a surface farthest from the wiring substrate.

Furthermore, the first conductive electrode 2156 and the second conductive electrode 2152 may have a height difference from each other in width and vertical directions (or thickness direction) at positions spaced apart along the width direction of the semiconductor light-emitting device.

The second conductive electrode 2152 is formed on the second conductive semiconductor layer 2153 using the height difference, but disposed adjacent to the second electrode 2040 located at an upper side of the semiconductor light-emitting device. As described above, a connection between the semiconductor light-emitting device and the wiring line may be formed in a top-down direction to allow a fine pitch arrangement, thereby implementing a display device having a high number of pixels.

More specifically, at least part of the second conductive electrode 2152 may protrude from a lateral surface of the second conductive semiconductor layer 2153 (or a lateral surface of the undoped semiconductor layer). As described above, since the second conductive electrode 2152 protrudes from the lateral surface, the second conductive electrode 2152 may be exposed to an upper side of the semiconductor light-emitting device. Through this, the second conductive electrode 2152 is disposed at a position overlapping the second electrode 2040 disposed at an upper side of the conductive adhesive layer 2030.

More specifically, the second conductive electrode 2152 extends from the inclined portion to a lateral surface of the plurality of semiconductor light-emitting devices (a lateral surface of the second semiconductor layer or a lateral surface of the undoped semiconductor layer), and the semiconductor light-emitting device has a protruding portion 2152a protruding from the lateral surface. In this case, referring to the protruding portion 2152a as a reference, the first conductive electrode 2156 and the second conductive electrode 2152 are disposed at positions spaced apart along the protruding direction of the protruding portion 2152a, and may be expressed such that they are formed to have a height difference from each other in a direction perpendicular to the protruding direction.

The second conductive electrode extending laterally from the inclined portion of the second conductive semiconductor layer 2153 extends to an upper surface of the second conductive semiconductor layer 2153 (or a upper surface of the undoped semiconductor layer). The protruding portion 2152a extends to the upper surface and then protrudes along the width direction. Accordingly, the protruding portion 2152a may be electrically connected to the second electrode 2040 on the opposite side of the first conductive electrode 2156 with respect to the second conductive semiconductor layer.

Meanwhile, the semiconductor light-emitting device may include a passivation layer 2157. In this case, the first inclined portion 2155a may be covered with the passivation layer 2157, and the passivation layer 2157 may extend to the first conductive semiconductor layer 2155. Furthermore, the passivation layer 2157 may be formed to cover a lateral surface of the second conductive semiconductor layer 2153 together with the first inclined portion 2155a.

According to the structure of a new semiconductor light-emitting device described above, it may be possible to simplify the etching processes of mesa and isolation to a single etching process, further increase the light emitting region, and allow fine pitch.

Hereinafter, a manufacturing method for forming a display device having a new semiconductor light-emitting device as described above will be described in detail with reference to the accompanying drawings. FIGS. 18A, 18B, 18C, 18D, 18E, 18F and 18G are cross-sectional views illustrating a method of manufacturing a display device using the semiconductor light-emitting device of the present disclosure, and FIG. 19 is a conceptual diagram illustrating another embodiment of a mask.

First, according to the manufacturing method, the process of sequentially growing the second conductive semiconductor layer and the first conductive semiconductor layer on a substrate to dispose the second conductive semiconductor layer under the first conductive semiconductor layer is carried out.

Figure 18A:
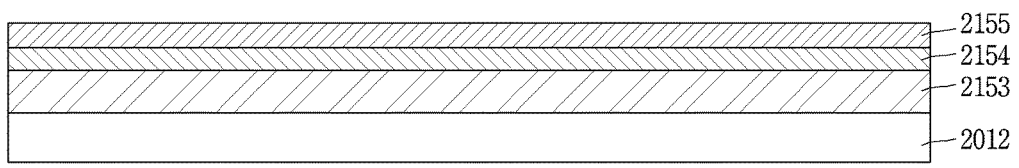
FIGS. 18A, 18B, 18C, 18D, 18E, 18F and 18G are cross-sectional views illustrating a method of manufacturing a display device using the semiconductor light-emitting device of the present disclosure.
Figure 19:
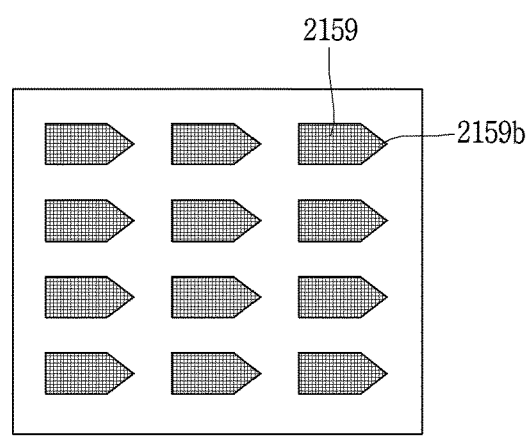
FIG. 19 is a conceptual diagram illustrating another embodiment of a mask.

Referring to FIG. 18A, a second conductive semiconductor layer 2153, an active layer 2154, and a first conductive semiconductor layer 2155 are grown on a growth substrate.

In this case, a substrate 2012 as a growth substrate for growing a semiconductor light-emitting device 2050 may be a sapphire substrate or silicon substrate. Furthermore, the substrate may be formed of a carrier wafer, which is a material suitable for semiconductor material growth. The growth substrate (W) may be formed of a material having an excellent thermal conductivity, and for example, a SiC substrate having a higher thermal conductivity than a sapphire ($Al_2O_3$) substrate or a SiC substrate including at least one of Si, GaAs, GaP, InP and $Ga_2O_3$ may be used.

Furthermore, the first conductive semiconductor layer 2155 may be a p-type semiconductor layer, and the second conductive semiconductor layer 2153 may be an n-type semiconductor layer. The p-type semiconductor layer, the active layer and the n-type semiconductor layer epitaxially grow on the substrate.

Next, the process of separating the p-type semiconductor from the n-type semiconductor, and isolating a plurality of semiconductor light-emitting devices from one another is carried out.

Figure 18B:
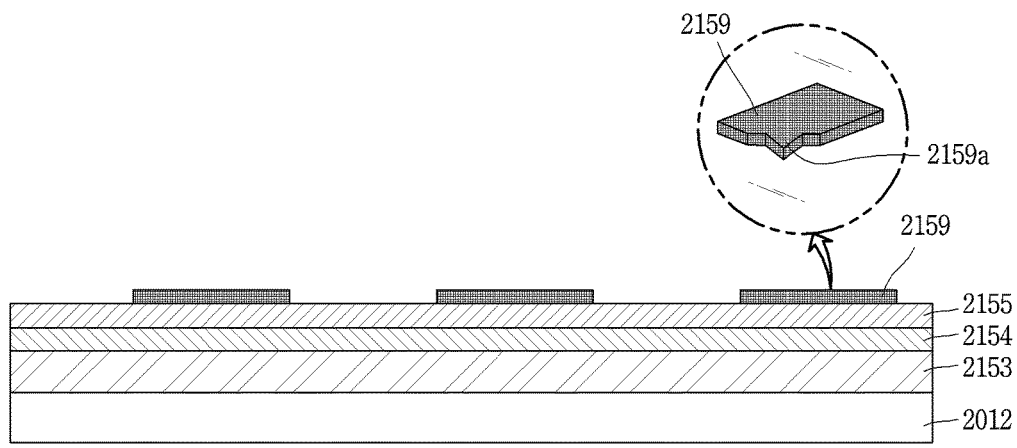
Figure 18C:
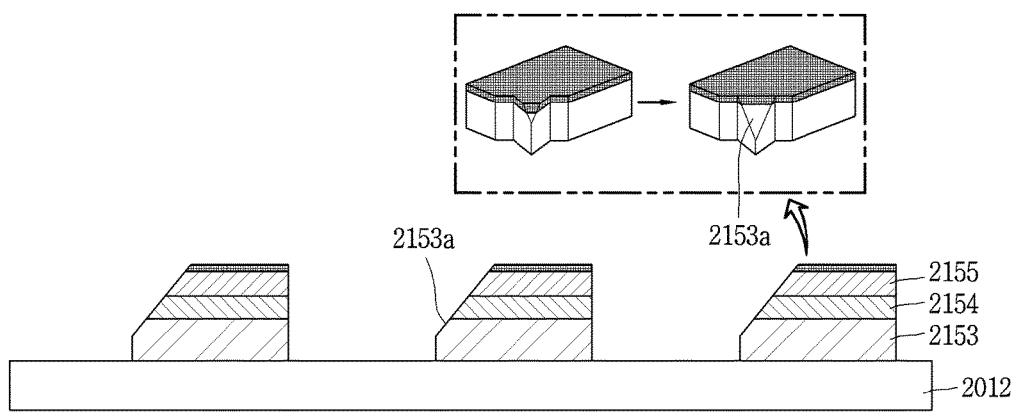
Figure 18D:
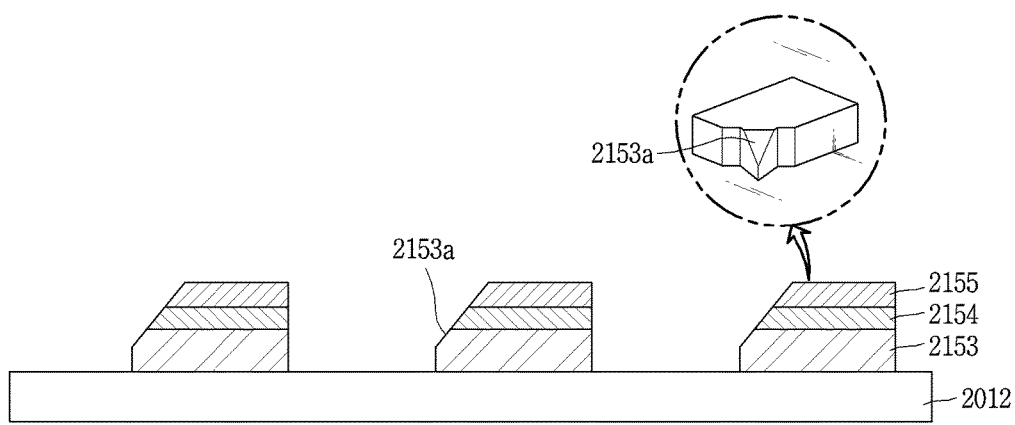

More specifically, as illustrated in FIG. 18B, a mask is layered on the first conductive semiconductor layer 2155, and the first conductive semiconductor layer 2155 and the second conductive semiconductor layer 2153 are etched to form a plurality of semiconductor light-emitting devices as illustrated in FIG. 18C, and the mask is removed as illustrated in FIG. 18D.

In this case, the second conductive semiconductor layer 2153 has an inclined portion 2153a inclined with respect to a lateral surface of the semiconductor light-emitting devices. For this purpose, the mask has a plurality of pattern portions 2159 arranged at specific intervals. For example, a protruding pattern 2159a protruded in a triangular shape may be formed on at least part of the pattern portions to form the inclined portion by the etching.

More specifically, except for the protruding pattern 2159a, only one side of the mask may form an obtuse angle with respect to the other sides at both ends, and the remaining sides thereof may form a pentagon perpendicular to each other. In this case, the protruding pattern 2159a may be disposed on the one side.

According to the drawing, the protruding pattern 2159a is disposed at one corner of the pattern portions, and the protruding pattern 2159a is gradually removed by the etching. It may be implemented by etching the first conductive semiconductor layer disposed below the protruding pattern 2159a in a lateral direction. In other words, the lateral etching of the first conductive semiconductor layer occurs at a pointed apex portion of the protruding pattern 2159a, and a mask existing at an upper portion of the etched portion is removed.

In this case, the etching may continue from the first conductive semiconductor layer 2155 to the active layer 2154 and the second conductive semiconductor layer 2153, and continue until a bottom surface of the growth substrate is exposed. The etching may be carried out by dry etching, for example, using BCl3/Cl2/Ar gas as a PR mask.

As described above, in this example, the first conductive semiconductor layer 2155 and the second conductive semiconductor layer 2153 are successively etched to form the semiconductor light-emitting devices on the substrate by a single etching process. According to the process described above, etching for separating a p-type semiconductor from an n-type semiconductor and etching for isolating a plurality of semiconductor light-emitting devices from each other on the substrate are implemented by a single etching process to form the foregoing inclined portion.

Meanwhile, the mask may be applied to other forms when a size of the semiconductor light-emitting device is reduced. Referring to FIG. 19, the mask may be formed with a plurality of pentagonal pattern portions 2159, and may form a quadrangle except for the protruding pattern 2159b, and the protruding pattern 2159b may be a triangle disposed at any one side of the quadrangle. Here, one side of the semiconductor light-emitting device is entirely inclined due to the etching, and therefore, the inclined portion is entirely located on one side of the second conductive semiconductor layer.

Figure 18E:
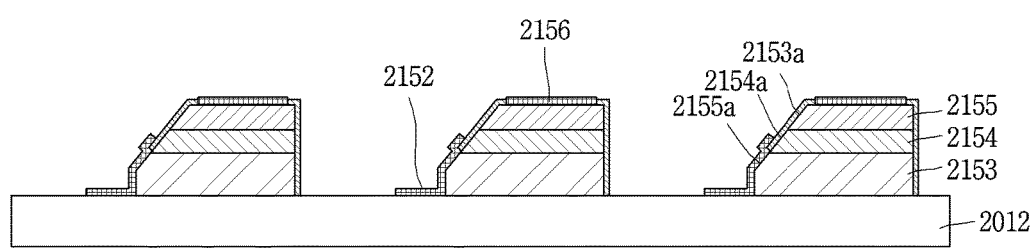
Figure 18F:
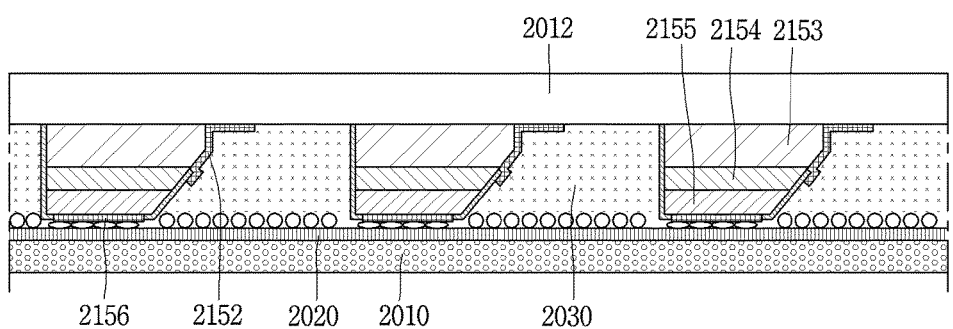

Next, the process of forming a passivation layer on a flip chip type light emitting device having the new structure, and depositing a first conductive electrode and a second conductive electrode on the first conductive semiconductor layer and the second conductive semiconductor layer, respectively, is carried out (FIG. 18E).

According to the drawing, the second conductive electrode 2152 is formed to cover the inclined portion 2153a. Here, the inclined portions 2155a, 2154a of the first conductive semiconductor layer and the active layer may be covered by the passivation layer 2157.

In this case, as described above, at least part of the second conductive electrode 2152 protrudes from a lateral surface of the second conductive semiconductor layer (or a lateral surface of the undoped semiconductor layer).

The flip chip type light emitting device having the new structure may be transferred to a wiring substrate by a method similar to the above-described manufacturing method with reference to FIG. 6.

Figure 18G:
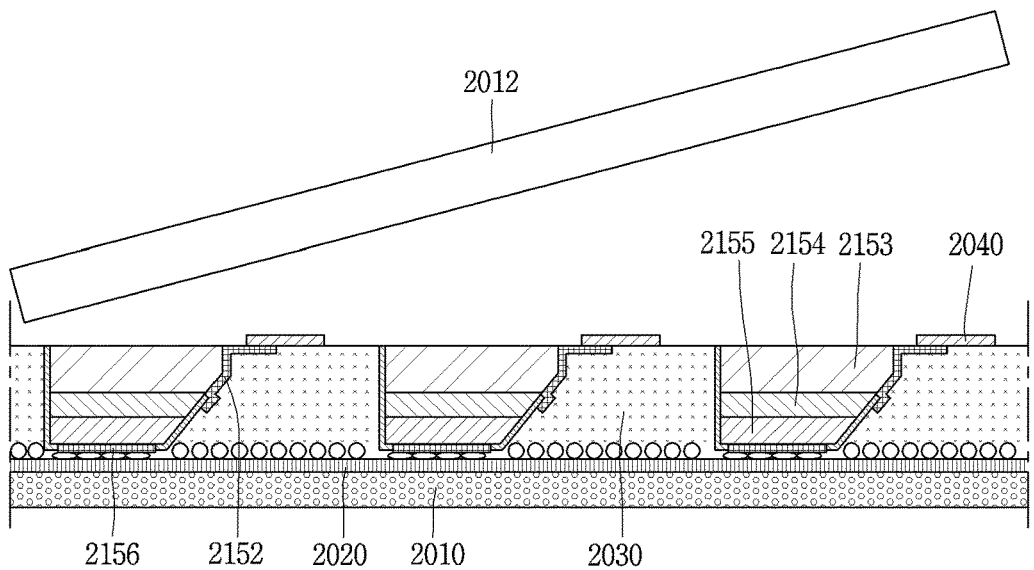

To this end, the flip chip type light emitting device having the new structure is coupled to the wiring substrate using the conductive adhesive layer 2030 (FIG. 18F), and the growth substrate is removed (FIG. 18G).

The wiring substrate is in a state where the first electrode 2020 is formed, and the first electrode 2020 is electrically connected to the first conductive electrode 2156 by a conductive ball or the like within the conductive adhesive layer 2030 as lower wiring. Then, a wiring line connecting the protruded second conductive electrode 3152 is formed. The wiring line may be a wiring line directly connected to the second conductive electrode 2152 as upper wiring.

According to the manufacturing method described above, a display device having the foregoing semiconductor light-emitting device with the new structure may be implemented. According to this manufacturing method and the new structure, it may be possible to obtain both an advantage of a horizontal semiconductor light-emitting device without a process of etching an undoped conductive semiconductor (unGan) for n-contact, and an advantage of a vertical semiconductor light-emitting device for allowing n-contact and p-contact even though the size is reduced in which the wirings are connected in different directions.

Meanwhile, a display device having the foregoing semiconductor light emitting element with a new structure may be modified into various forms. Hereinafter, other embodiments of the display device will be described with reference to FIGS. 20 and 21.

Figure 20:
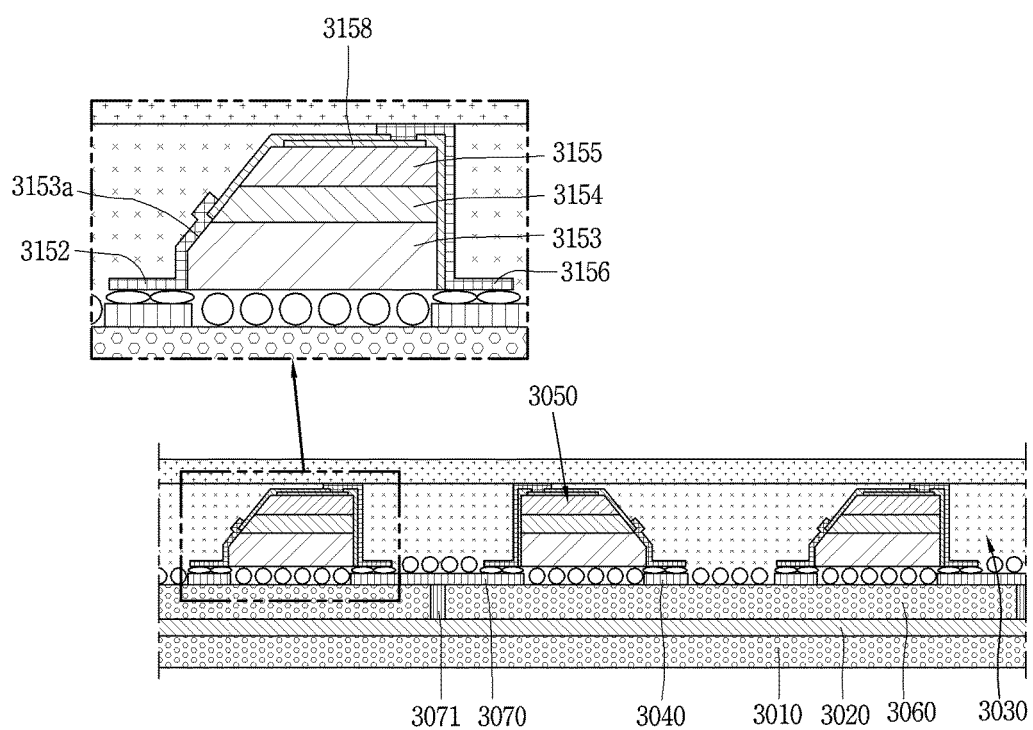
FIGS. 20 and 21 are cross-sectional views in which a cross section taken along line G-G is assumed when a semiconductor light-emitting device according to another embodiment is applied to the display device in FIG. 13.
Figure 21:
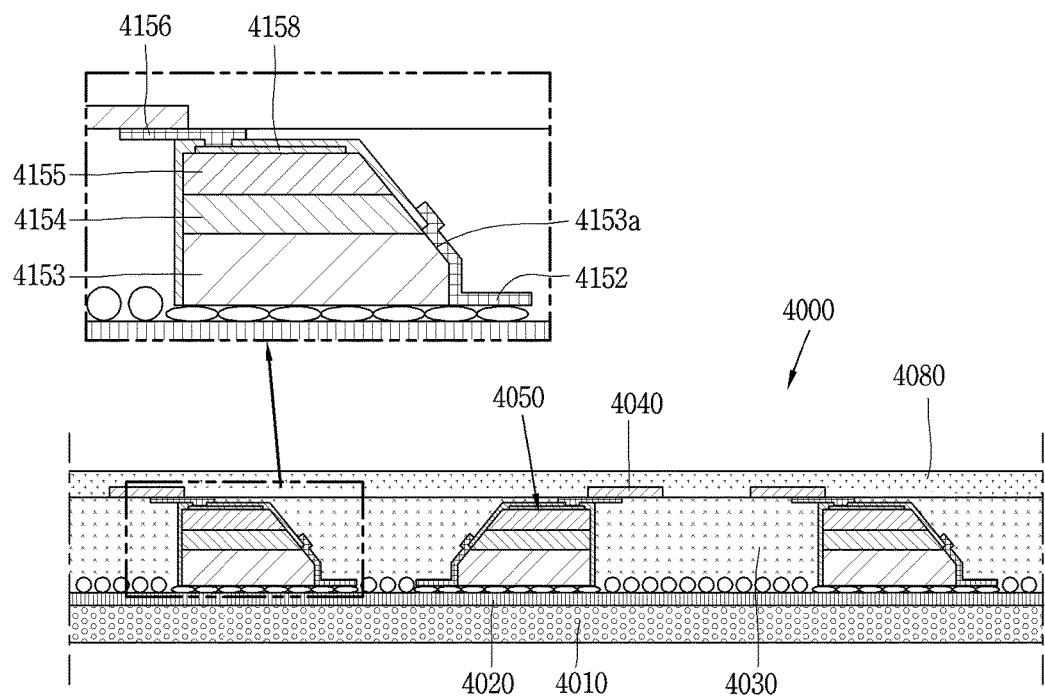

FIGS. 20 and 21 are cross-sectional views in which a cross section taken along line G-G is assumed when a semiconductor light-emitting device according to another embodiment is applied to the display device in FIG. 13.

In the present example to be described below, the same or similar reference numerals are designated to the same or similar components as those of the example described above with reference to FIGS. 10 through 12 or FIGS. 13 through 19, and the description thereof will be substituted by the earlier description. For example, the structure of the wiring board and the plurality of semiconductor light-emitting devices in a display device is different from the above example, and therefore, the description of other elements excluding them will be substituted by the description with reference to FIG. 10 through FIG. 12 or FIG. 13 through FIG. 19.

First, referring to FIG. 20, a semiconductor light-emitting device 3050 includes a first conductive electrode 3156 electrically connected to a first conductive semiconductor layer 3155, and a second conductive electrode 3152 electrically connected to a second conductive semiconductor layer 3153.

Here, as an example described with reference to FIGS. 13 through 19, the second conductive semiconductor layer 3153 includes an inclined portion inclined with respect to a lateral surface of the second conductive semiconductor layer 3153, and the conductive electrode 3152 is formed to cover the inclined portion. The inclined portion extends to the first conductive semiconductor layer 3155, and is formed at one corner of the semiconductor light-emitting device. Accordingly, also in this example, the first conductive semiconductor layer and the second conductive semiconductor layer may be etched by a single etching process using the inclined portion.

According to the drawings, the second conductive electrode 3152 may extend from an inclined portion 3153a of the second conductive semiconductor layer to the lateral surface, and protrude from the lateral surface in a direction away from the second conductive semiconductor layer 3153.

In this case, the first conductive electrode 3156 may be formed on one surface of the first conductive semiconductor layer 3155, and protrude from the lateral surface in a direction away from the semiconductor light-emitting device. Through this structure, the first conductive electrode and the second conductive electrode are connected to the wiring electrode on the same plane.

On the other hand, light is emitted from one surface of the first conductive semiconductor layer 3155, and thus it is more advantageous for the first conductive electrode 3156 to reduce a size covering the one surface. Therefore, a transparent electrode 3158 may be disposed between the first conductive semiconductor layer 3155 and the first conductive electrode 3156. The transparent electrode 3158 may be covered with a passivation layer 3157, and a through hole for connecting the transparent electrode and the first conductive electrode 3156 may be formed on the passivation layer 3157.

The first conductive electrode and the second conductive electrode may be disposed on the same plane, and therefore, a substrate 3010 having the same structure as that of the exemplary substrate with reference to FIGS. 2, 3A, and 3B may be applied to a wiring substrate of this example. Here, a portion protruding from the first conductive electrode 3156 may be electrically connected to an auxiliary electrode 3070, the auxiliary electrode is connected to a first electrode 3020, and a portion protruding from the second conductive electrode 3152 may be electrically connected to a second electrode 3040.

Next, referring to FIG. 21, a semiconductor light-emitting device 4050 includes a first conductive electrode 4156 electrically connected to a first conductive semiconductor layer 4155, and a second conductive electrode 4152 electrically connected to a second conductive semiconductor layer 4153.

Here, as an example described with reference to FIGS. 13 through 19, the second conductive semiconductor layer 4153 includes an inclined portion 4153a inclined with respect to a lateral surface of the second conductive semiconductor layer 4153, and the conductive electrode 4152 is formed to cover the inclined portion 4153a. The inclined portion extends to the first conductive semiconductor layer 4155, and is formed at one corner of the semiconductor light-emitting device. Accordingly, also in this example, the first conductive semiconductor layer and the second conductive semiconductor layer may be etched by a single etching process using the inclined portion.

According to the drawings, the second conductive electrode 4152 may extend from an inclined portion 4153a of the second conductive semiconductor layer to the lateral surface, and protrude from the lateral surface in a direction away from the second conductive semiconductor layer 4153.

On the other hand, a second electrode 3040 is formed on the substrate 4010, and a protruding portion of the second conductive electrode 4152 is electrically connected to the second electrode.

In this case, the first conductive electrode 3156 may be formed on one surface of the first conductive semiconductor layer 3155, and protrude from the one surface in a direction away from the semiconductor light-emitting device. A protruding portion of the first conductive electrode 4156 is disposed on an opposite side to a protruding portion of the second conductive electrode. In other words, the first conductive electrode and the second conductive electrode are disposed above and below the semiconductor light-emitting device, respectively, and have a height difference from each other.

According to the drawings, the first conductive electrode is electrically connected to the first electrode forming an upper wiring of the semiconductor light-emitting device.

On the other hand, light is emitted from one surface of the first conductive semiconductor layer 3155, and thus it is more advantageous for the first conductive electrode 3156 to reduce a size covering the one surface. Therefore, a transparent electrode 3158 may be disposed between the first conductive semiconductor layer 3155 and the first conductive electrode 3156. The transparent electrode 3158 may be covered with a passivation layer 3157, and a through hole for connecting the transparent electrode and the first conductive electrode 3156 may be formed on the passivation layer 3157.

As described above, in this example, a connection between the semiconductor light-emitting device and the wiring line may be formed in a top-down direction to allow a fine pitch arrangement, thereby implementing a display device having a high number of pixels.

The configurations and methods according to the above-described embodiments will not be applicable in a limited way to the foregoing display device using a semiconductor light-emitting device, and all or part of each embodiment may be selectively combined and configured to make various modifications thereto.

What is claimed is:

1. A display device comprising a semiconductor light-emitting device, wherein the semiconductor light-emitting device comprises:
   a first conductive semiconductor layer;
   a second conductive semiconductor layer provided with a lateral surface to overlap with the first conductive semiconductor layer;
   a first conductive electrode electrically connected to the first conductive semiconductor layer; and
   a second conductive electrode electrically connected to the second conductive semiconductor layer,
   wherein the second conductive semiconductor layer is provided with an inclined portion inclined with respect to the lateral surface, and the second conductive electrode is configured to cover the inclined portion,
   wherein an upper surface the semiconductor light-emitting device includes one side having both ends forming an obtuse angle with respect to other sides of the upper surface, and
   wherein the inclined portion is formed at the one side.

2. The display device of claim 1, wherein the inclined portion extends to the first conductive semiconductor layer.

3. The display device of claim 2, wherein on the inclined portion, a portion corresponding to the first conductive semiconductor layer is a first inclined portion, and a portion corresponding to the second conductive semiconductor layer is a second inclined portion, and
the first and second inclined portions are formed at one corner of the semiconductor light-emitting device.

4. The display device of claim 3, wherein the first and second inclined portions form a triangle at the one corner.

5. The display device of claim 3, wherein an active layer is formed between the first conductive semiconductor layer and the second conductive semiconductor layer, and
a third inclined portion connected to the second inclined portion is formed on the active layer.

6. The display device of claim 3, wherein the first inclined portion is covered by a passivation layer.

7. The display device of claim 6, wherein the passivation layer extends to cover the first conductive semiconductor layer.

8. The display device of claim 6, wherein the passivation layer is formed to cover the lateral surface together with the first inclined portion.

9. The display device of claim 1, wherein the second conductive electrode extends from the inclined portion to the lateral surface, and protrudes from the lateral surface in a direction away from the second conductive semiconductor layer.

10. The display device of claim 1, wherein an undoped semiconductor layer is formed on a lower surface of the second conductive semiconductor layer, and the second conductive electrode extends to a lateral surface of the undoped semiconductor layer from the inclined portion.

11. A semiconductor light-emitting device, comprising:
a first conductive semiconductor layer;
a second conductive semiconductor layer provided with a lateral surface to overlap with the first conductive semiconductor layer;
a first conductive electrode electrically connected to the first conductive semiconductor layer; and
a second conductive electrode electrically connected to the second conductive semiconductor layer,
wherein the second conductive semiconductor layer is provided with an inclined portion inclined with respect to the lateral surface, and the second conductive electrode is configured to cover the inclined portion,
wherein an upper surface the semiconductor light-emitting device includes one side having both ends forming an obtuse angle with respect to other sides of the upper surface, and
wherein the inclined portion is formed at the one side.

12. The semiconductor light-emitting device of claim 11, wherein the inclined portion extends to the first conductive semiconductor layer.

13. The semiconductor light-emitting device of claim 11, wherein the inclined portion is formed at one corner of the semiconductor light-emitting device.

\* \* \* \* \*